United States Patent
Fujii

(10) Patent No.: US 11,249,345 B2
(45) Date of Patent: Feb. 15, 2022

(54) WHITE LED PACKAGE, LIGHT-EMITTING DEVICE, SURFACE LIGHT SOURCE DEVICE AND DISPLAY DEVICE

(71) Applicant: Enplas Corporation, Saitama (JP)

(72) Inventor: Yuki Fujii, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 17/361,416

(22) Filed: Jun. 29, 2021

(65) Prior Publication Data

US 2021/0405453 A1     Dec. 30, 2021

(30) Foreign Application Priority Data

Jun. 30, 2020    (JP) .............................. JP2020-113033

(51) Int. Cl.

| | |
|---|---|
| *G02F 1/1335* | (2006.01) |
| *H01L 25/075* | (2006.01) |
| *G02F 1/13357* | (2006.01) |
| *H01L 33/58* | (2010.01) |
| *H01L 33/50* | (2010.01) |

(52) U.S. Cl.
CPC .. *G02F 1/133607* (2021.01); *G02F 1/133603* (2013.01); *H01L 25/0753* (2013.01); *H01L 33/50* (2013.01); *H01L 33/58* (2013.01)

(58) Field of Classification Search
CPC ......... G02F 1/133607; G02F 1/133603; H01L 25/0753; H01L 33/50; H01L 33/58
See application file for complete search history.

(56) References Cited

U.S. PATENT DOCUMENTS

| | | | |
|---|---|---|---|
| 10,453,828 B1 * | 10/2019 | Ouderkirk | ........... H01L 25/0753 |
| 10,921,499 B1 * | 2/2021 | Ouderkirk | ............. G02B 5/0278 |
| 2014/0153238 A1 * | 6/2014 | Nishimura | ........... H01L 25/0753 362/237 |
| 2020/0243733 A1 * | 7/2020 | Imai | ..................... H01L 33/502 |

FOREIGN PATENT DOCUMENTS

| | | | | |
|---|---|---|---|---|
| JP | 2014-027156 | | 2/2014 | |
| WO | WO-2017038209 A1 * | 3/2017 | ........... H01L 33/642 |

* cited by examiner

*Primary Examiner* — Mary Ellen Bowman

(57) ABSTRACT

Condition 1 (an absolute value of a difference between IB×B and EB×B is 55% or smaller) and condition 2 (an absolute value of a difference between IY×Y and EY×Y is 55% or smaller) are satisfied, where, when an area of the light-emitting surface is equally divided into inner and outer regions by a boundary line as an outer edge of a region similar in shape to the light-emitting surface in plan view of a white LED package, IB (%) is an area ratio of blue LED chips in the inner region; IY (%) is an area ratio of the region where no blue LED chips is disposed in the inner region; EB (%) is an area ratio of the blue LED chips in the outer region; and EY (%) is an area ratio of the region where no blue LED chip is disposed in the outer region.

8 Claims, 14 Drawing Sheets

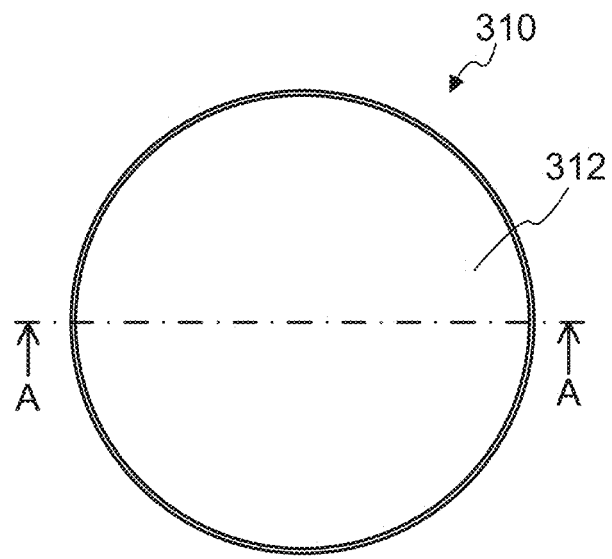
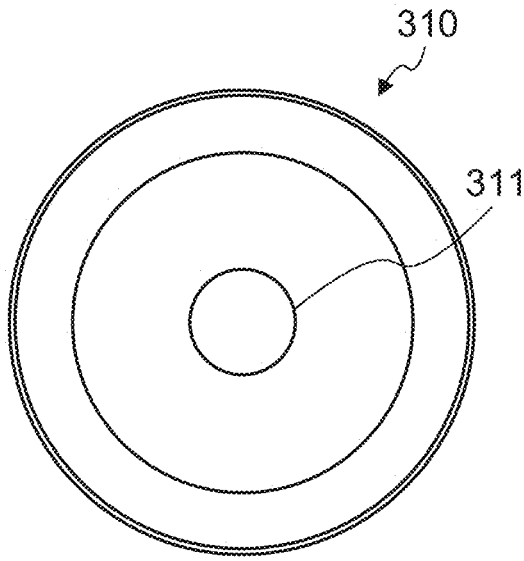
FIG. 4A
FIG. 4B
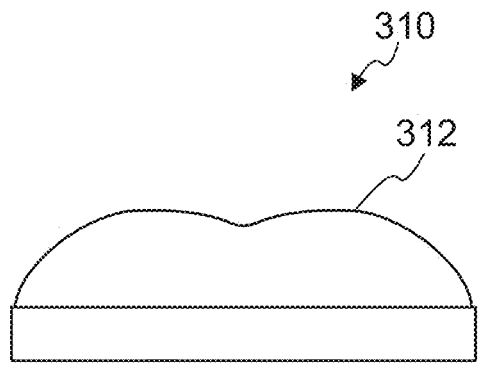
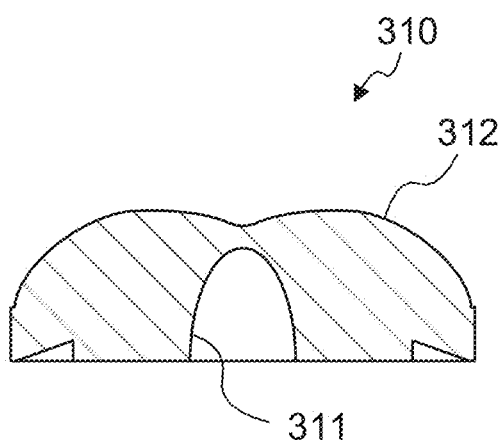
FIG. 4C
FIG. 4D

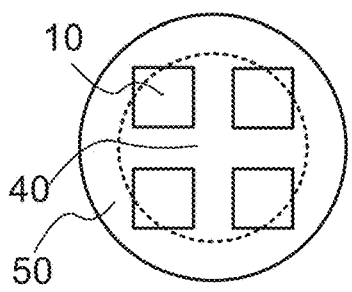
FIG. 7A
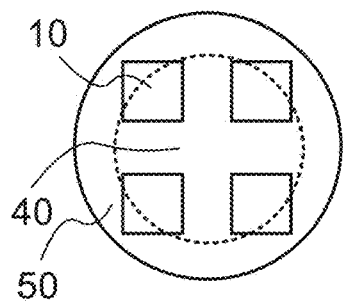
FIG. 7B
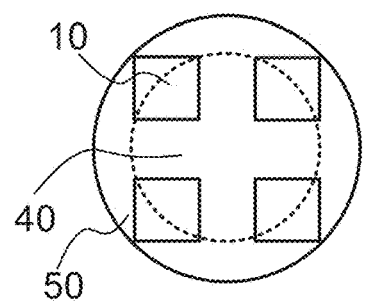
FIG. 7C
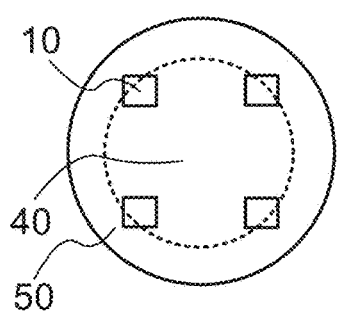
FIG. 7D
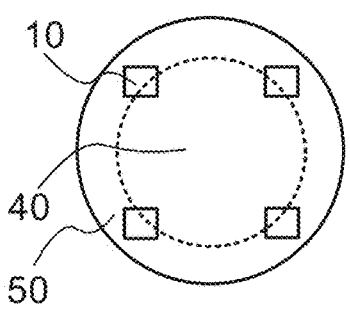
FIG. 7E
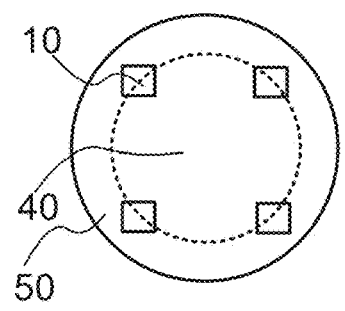
FIG. 7F
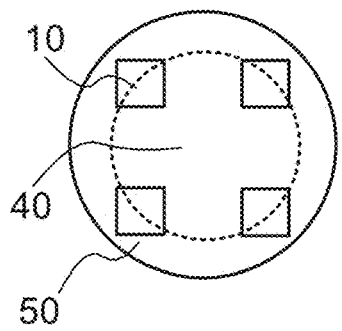
FIG. 7G
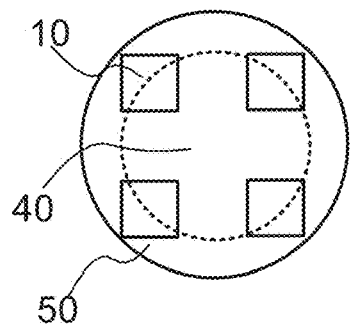
FIG. 7H
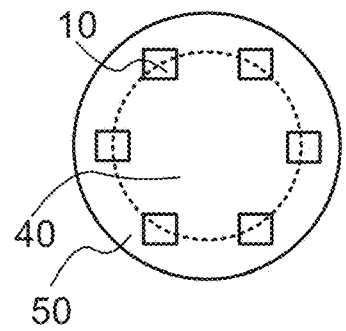
FIG. 7I
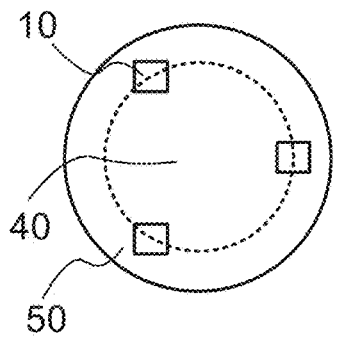
FIG. 7J
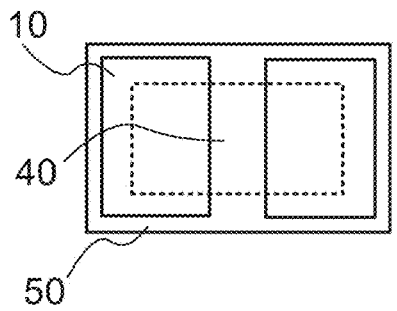
FIG. 7K
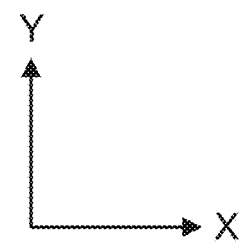

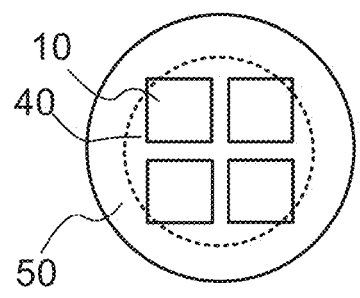
FIG. 8A
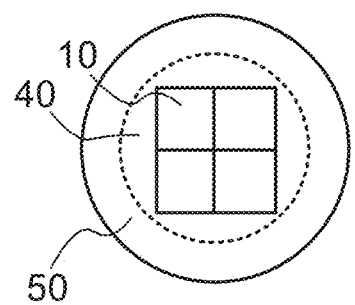
FIG. 8B
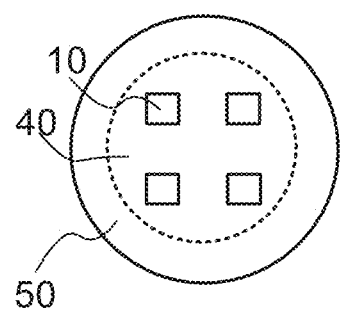
FIG. 8C
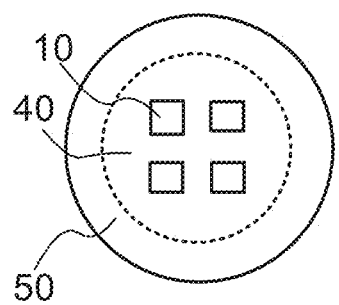
FIG. 8D
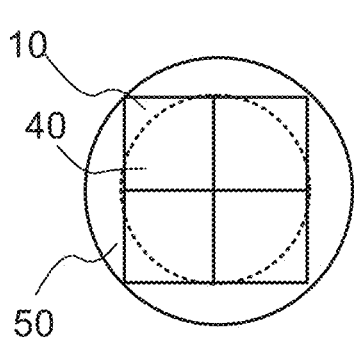
FIG. 8E
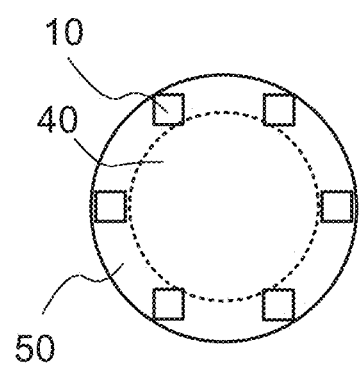
FIG. 8F
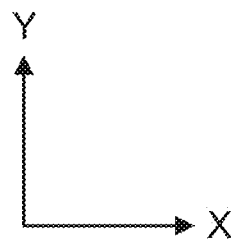

WHITE LED PACKAGE, LIGHT-EMITTING DEVICE, SURFACE LIGHT SOURCE DEVICE AND DISPLAY DEVICE

CROSS REFERENCE TO RELATED APPLICATIONS

This application is entitled to and claims the benefit of Japanese Patent Application No. 2020-113033, filed on Jun. 30, 2020, the disclosure of which including the specification, drawings and abstract is incorporated herein by reference in its entirety.

TECHNICAL FIELD

The present invention relates to a white LED package, a light-emitting device, a surface light source device and a display device.

BACKGROUND ART

LED packages including light-emitting diodes (LEDs) are used as light sources of illumination apparatuses and backlights. Light from an LED package is controlled by a lens (light flux controlling member) disposed over the LED package, and the controlled light is applied to a light diffusion plate and spread in a planar fashion, thus serving a function as a surface light source device.

An LED package includes, for example, one or more LED chips mounted on a substrate, and a resin that seals the LED chip. PTL 1 discloses such an LED package. This LED package includes a plurality of LED chips mounted on a package substrate, and a resin that seals the LED chip. This LED package suppresses luminance unevenness with a plurality of LED chips disposed in intimate contact with each other with no gap therebetween.

CITATION LIST

Patent Literature

PTL 1
Japanese Patent Application Laid-Open No. 2014-27156

SUMMARY OF INVENTION

Technical Problem

A white LED package that emits white light includes one or more blue LED chips, and a sealing resin including a yellow phosphor. In such a white LED package, white light is obtained by mixing blue light emitted from the blue LED chip and yellow light generated by the yellow phosphor irradiated with the blue light.

In the above-mentioned white LED package, color unevenness may be caused due to the conspicuity of white close to blue and white close to yellow especially when white light is spread by the light flux controlling member. In addition, if a white LED package that emits white light containing the above-mentioned color unevenness is used in a surface light source device, color unevenness may possibly occur at the light-emitting surface of the surface light source device even when a light flux controlling member and a light diffusion plate are used.

To solve the above-mentioned problems, an object of the present invention is to provide a white LED package, a light-emitting device including the white LED package, a surface light source device including the light-emitting device, and a display device including the surface light source device that can provide white light with less color unevenness.

Solution to Problem

A white LED package of an embodiment of the present invention includes: a plurality of blue LED chips, and a sealing member including a yellow phosphor and configured to seal the plurality of blue LED chips. Assuming that intensities of blue light and yellow light emitted from a light-emitting surface of the white LED package are equal to each other, a blue light emission density B is calculated from the intensity of the blue light and an area of the plurality of blue LED chips in plan view of the light-emitting surface, and a yellow light emission density Y is calculated from the intensity of the yellow light and an area of a region where the plurality of blue LED chips is not disposed in plan view of the light-emitting surface. The following condition 1 and condition 2 are satisfied: the condition 1: an absolute value of a difference between IB×B and EB×B is 55% or smaller; and the condition 2: an absolute value of a difference between IY×Y and EY×Y is 55% or smaller, where, when an area of the light-emitting surface is divided into an inner region and an outer region so as to divide the area into two equal parts by a boundary line as an outer edge of a similar region that is similar in shape to the light-emitting surface in plan view of the white LED package, the similar region having a center or a center of gravity at a same position as a center or a center of gravity of the light-emitting surface, IB (%) is a ratio of an area of the plurality of blue LED chips in the inner region with respect to an area of the inner region; IY (%) is a ratio of an area of a region where the plurality of blue LED chips is not disposed in the inner region with respect to the area of the inner region; EB (%) is a ratio of an area of the plurality of blue LED chips in the outer region with respect to an area of the outer region; and EY (%) is a ratio of an area of a region where the plurality of blue LED chips is not disposed in the outer region with respect to the area of the outer region.

A light-emitting device of an embodiment of the present invention includes: the white LED package according to claim 1; and a light flux controlling member configured to control light emitted from the white LED package.

A surface light source device of an embodiment of the present invention includes: the light-emitting device; and a diffusion plate configured to transmit light emitted from the light-emitting device, the diffusion plate being configured to transmit the light while diffusing the light.

A display device of an embodiment of the present invention includes: the surface light source device; and a display member configured to be irradiated with light from the surface light source device.

Advantageous Effects of Invention

According to the present invention, it is possible to provide a white LED package, a light-emitting device including the white LED package, and a surface light source device including the light-emitting device that can provide white light with less color unevenness.

BRIEF DESCRIPTION OF DRAWINGS

FIG. 4A is a plan view illustrating a diffusion lens, FIG. 4B is a bottom view, FIG. 4C is a side view, and FIG. 4D is a sectional view taken along line A-A of FIG. 4A;

FIGS. 7A to 7K are plan views of light-emitting surfaces of white LED packages of Examples of the present invention;

FIGS. 8A to 8F are plan views of light-emitting surfaces of white LED packages of Comparative Examples;

DESCRIPTION OF EMBODIMENTS

Figure 1A:
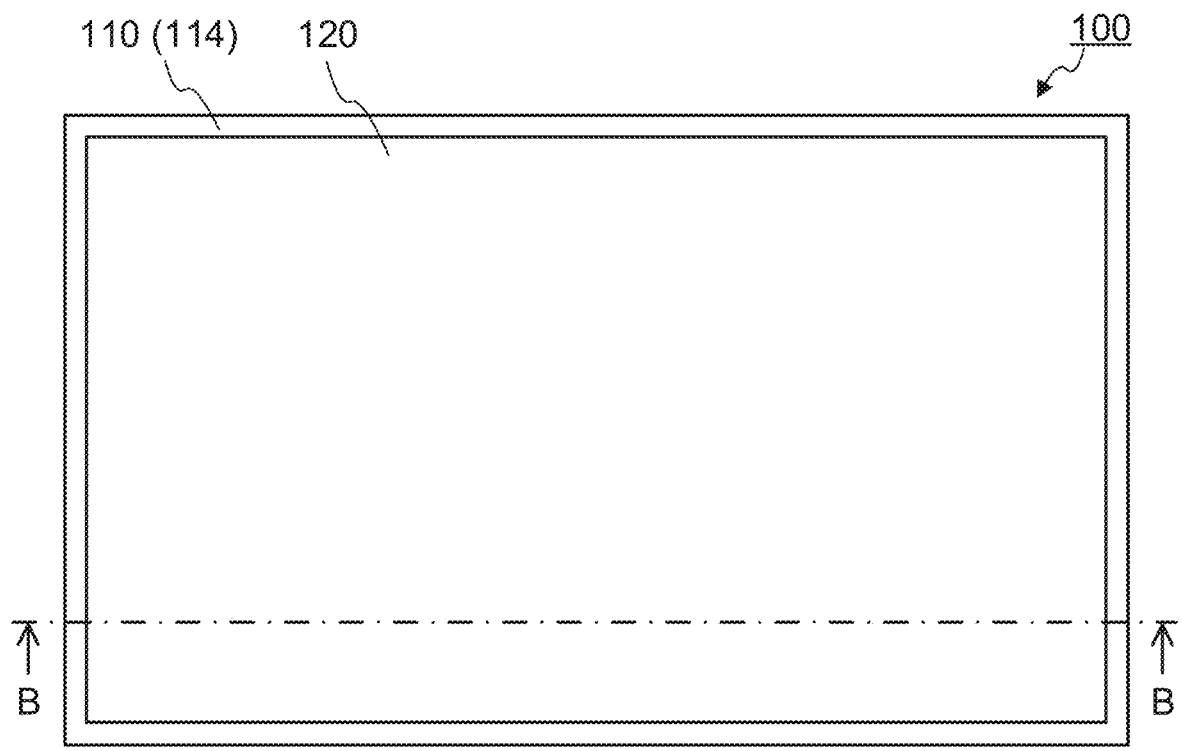
FIG. 1A is a plan view of a surface light source device according to an embodiment of the present invention.
Figure 1B:
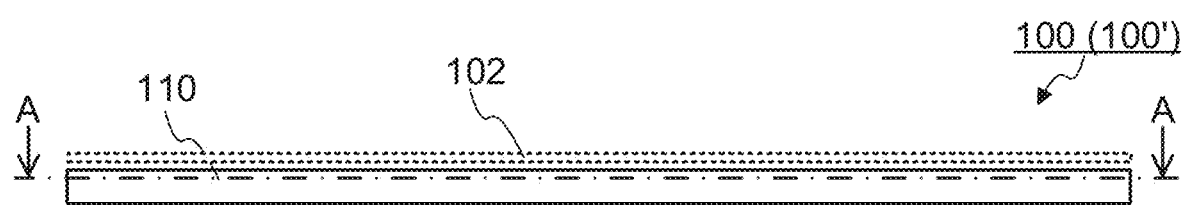
FIG. 1B is a front view of the surface light source device according to the embodiment of the present invention.
Figure 2A:
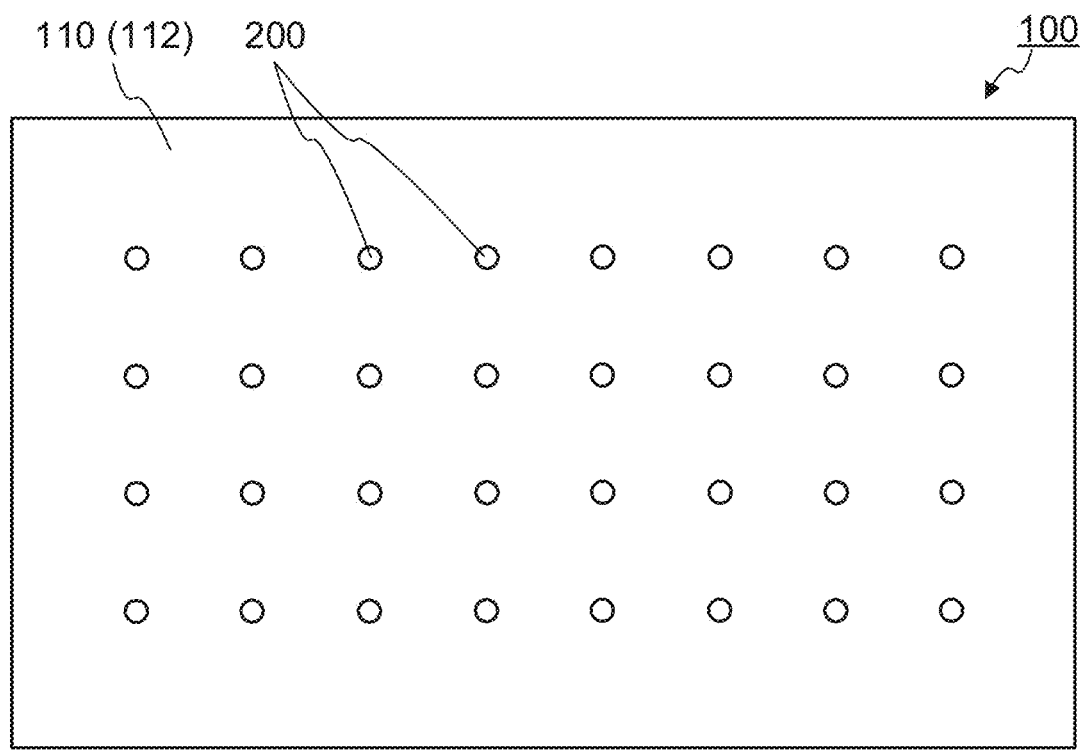
FIG. 2A is a sectional view taken along line A-A of FIG. 1B.
Figure 2B:
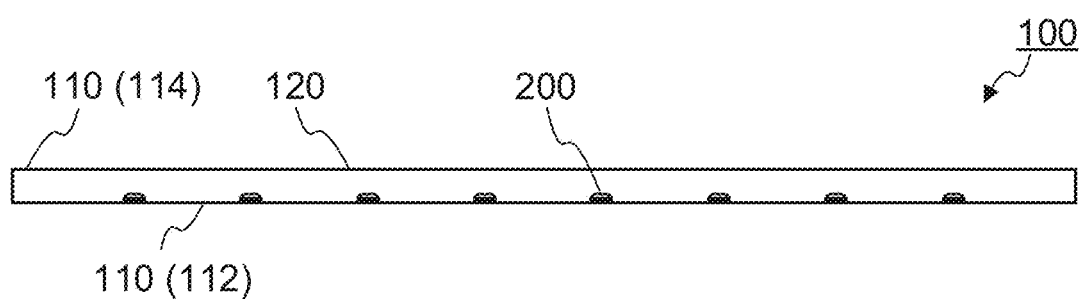
FIG. 2B is a sectional view taken along line B-B of FIG. 1A.
Figure 3:
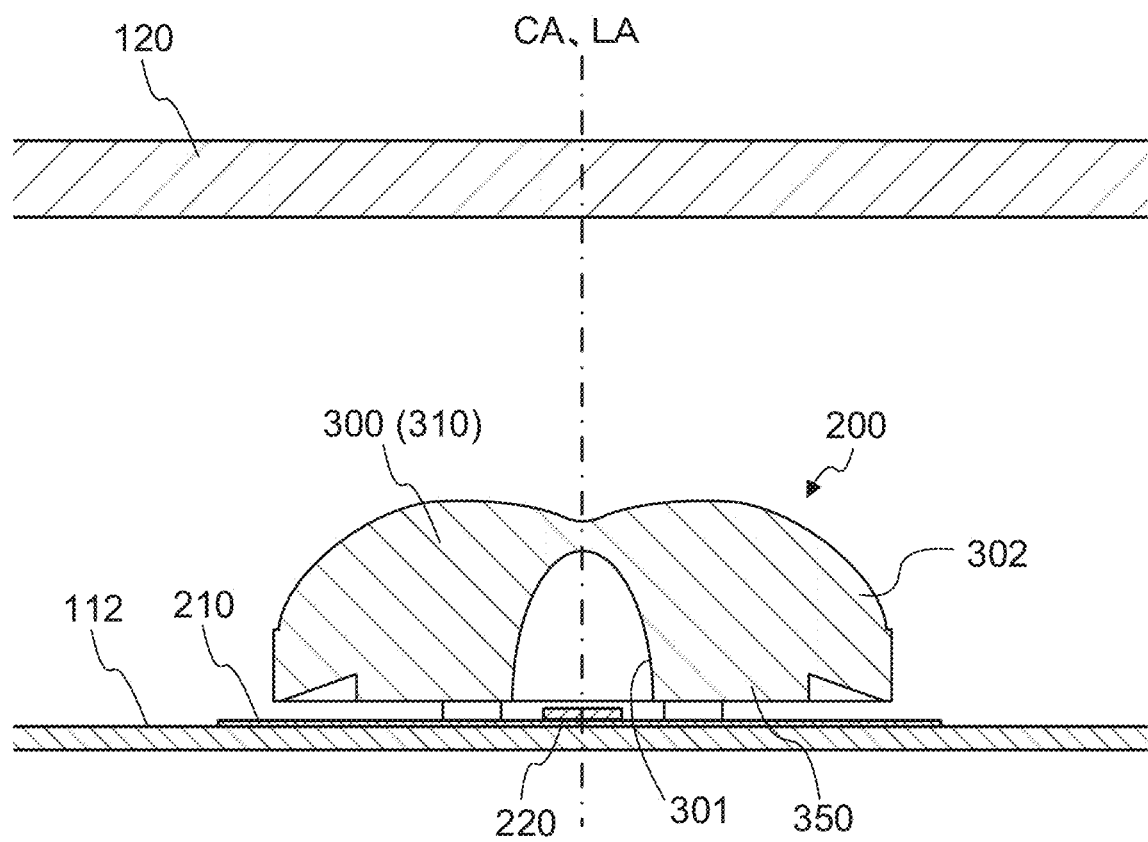
FIG. 3 is a partially enlarged sectional view of FIG. 2B.

An embodiment of the present invention is elaborated below with reference to the accompanying drawings.
Configurations of Surface Light Source Device and Light-Emitting Device FIGS. 1 to 3 illustrate a configuration of surface light source device 100 according to the embodiment. FIG. 1A is a plan view, and FIG. 1B is a front view. FIG. 2A is a sectional view taken along line A-A of FIG. 1B, and FIG. 2B is a sectional view taken along line B-B of FIG. 1A. FIG. 3 is a partially enlarged sectional view of FIG. 2B. As illustrated in FIG. 1B, surface light source device 100 can be used as display device 100' when combined with a display member (irradiation target member) 102 (e.g., a liquid crystal panel) that is irradiated with light from surface light source device 100.

As illustrated in FIGS. 1 and 2, surface light source device 100 includes housing 110, a plurality of light-emitting devices 200 and light diffusion plate 120. The plurality of light-emitting devices 200 is disposed in a matrix on bottom plate 112 of housing 110. The inner surface of bottom plate 112 functions as a diffusive reflection surface. In addition, top plate 114 of housing 110 is provided with an opening. Light diffusion plate 120 is disposed to close the opening and function as a light-emitting surface. For example, the size of light-emitting surface is, but not limited to, approximately 400 mm×approximately 700 mm.

As illustrated in FIG. 3, each light-emitting device 200 is fixed on substrate 210. Each substrate 210 is fixed at a predetermined position on bottom plate 112 of housing 110. Each of the plurality of light-emitting devices 200 includes white LED package 220 and light flux controlling member 300.

White LED package 220 is a light source of surface light source device 100 and is mounted on substrate 210. A main feature of surface light source device 100 according to the present embodiment is the configuration of white LED package 220. Therefore, white LED package 220 is elaborated later.

Light flux controlling member 300 is fixed on substrate 210, and controls the distribution of light emitted from white LED package 220. In the present embodiment, light flux controlling member 300 is diffusion lens 310 that spreads light emitted from white LED package 220. Light flux controlling member 300 is disposed over white LED package 220 such that its central axis CA matches light axis LA of white LED package 220. In the present embodiment, each of incidence surface 301 and emission surface 302 of light flux controlling member 300 is rotationally symmetrical (circularly symmetrical), and their rotation axes match each other. The rotation axes of incidence surface 301 and emission surface 302 are referred to as "central axis CA of the light flux controlling member". In addition, "light axis LA of white LED package" means a central light beam of a stereoscopic light flux emitted from white LED package 220.

FIG. 4A is a plan view of diffusion lens 310, FIG. 4B is a bottom view of diffusion lens 310, FIG. 4C is a side view of diffusion lens 310, and FIG. 4D is a sectional view taken along line A-A of FIG. 4A.

As illustrated in FIGS. 4A to 4D, diffusion lens 310 includes incidence surface 311 and emission surface 312. Diffusion lens 310 is configured to emit, from emission surface 312, light entered from incidence surface 311, while spreading the light.

Light flux controlling member 300 is formed by integral molding. The material of light flux controlling member 300 is not limited as long as the material can transmit the light of a desired wavelength. Examples of the material of light flux controlling member 300 include optically transparent resins such as polymethylmethacrylate (PMMA), polycarbonate (PC) and epoxy resin (EP), and glass.

Light diffusion plate 120 is a plate-shaped member with light diffusibility, and transmits light emitted from light-emitting device 200 while diffusing the light. Normally, light diffusion plate 120 has substantially the same size as the irradiation target member such as a liquid crystal panel. For example, light diffusion plate 120 is formed of an optically transparent resin such as polymethylmethacrylate (PMMA), polycarbonate (PC), polystyrene (PS), and styrene methyl methacrylate copolymerization resin (MS). To provide the light diffusibility, minute irregularity is formed in the surface of light diffusion plate 120, or a light diffuser such as beads is dispersed inside light diffusion plate 120.

In surface light source device 100 according to the present embodiment, light emitted from each white LED package 220 is spread by light flux controlling member 300 to illuminate a wide range of light diffusion plate 120. The light emitted from each light flux controlling member 300 is further diffused by light diffusion plate 120. As a result, surface light source device 100 according to the present embodiment can uniformly illuminate the planar irradiation target member (such as a liquid crystal panel).

Configuration of White LED Package

Figure 5:
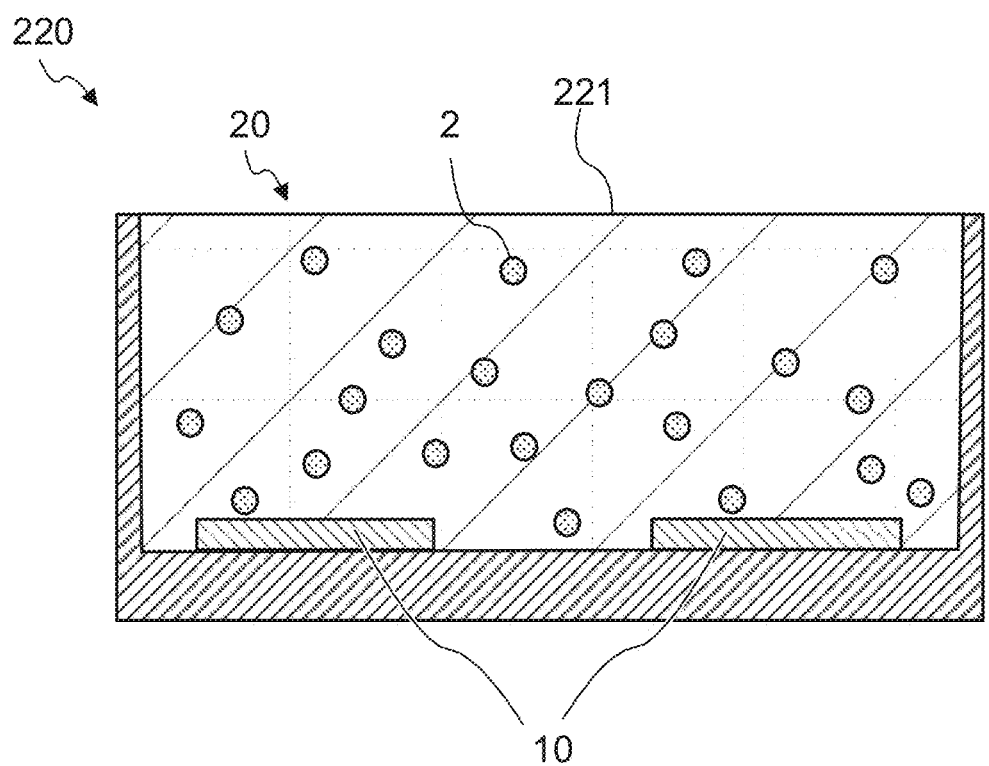
FIG. 5 is a sectional view of a white LED package.
Figure 6A:
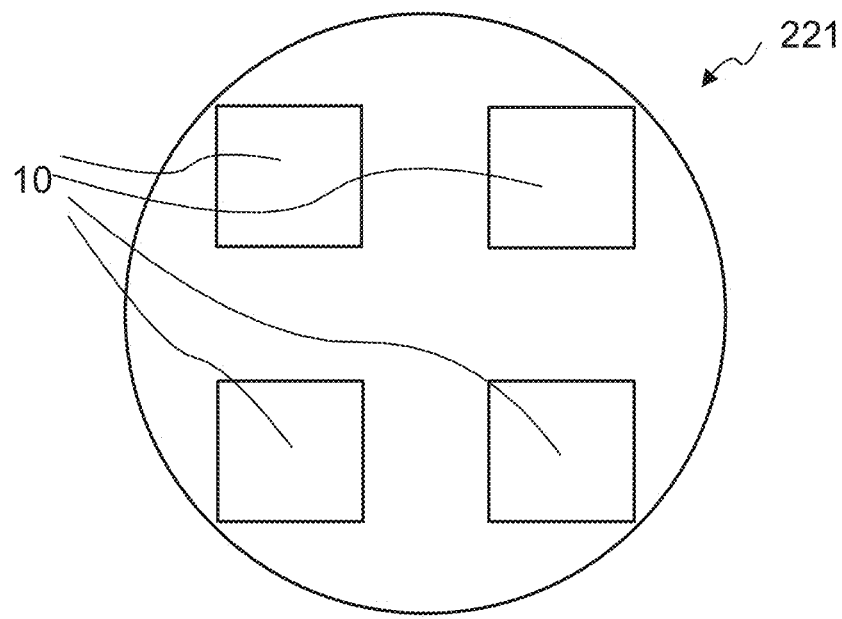
FIGS. 6A and 6B are plan views of a light-emitting surface of a white LED package.
Figure 6B:
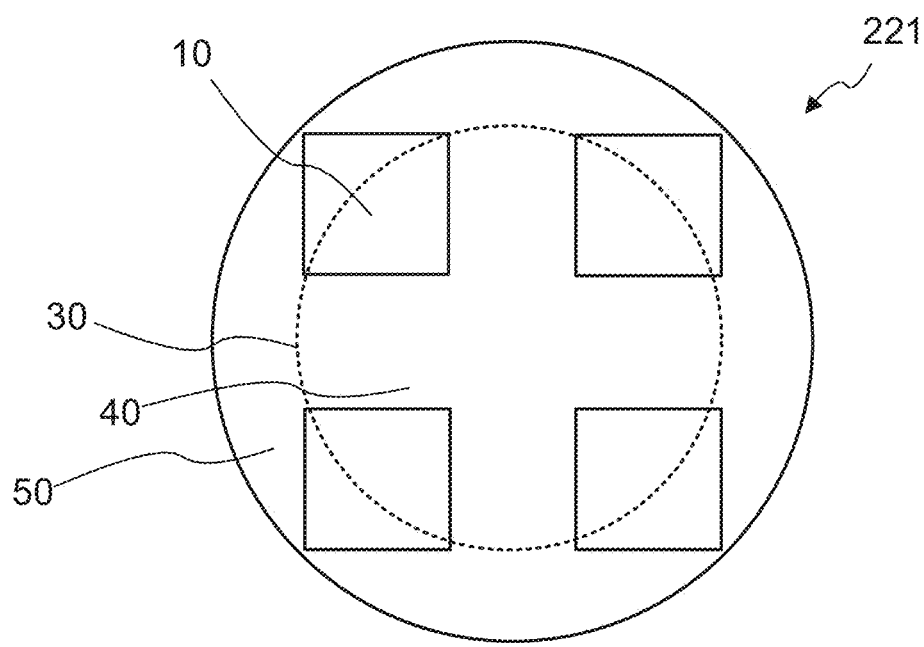
Figure 9A:
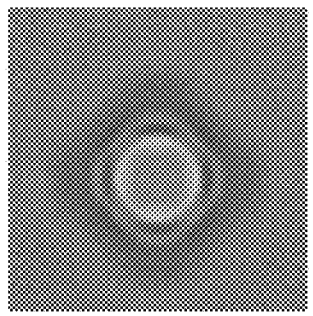
FIGS. 9A to 9K show color unevenness of white LED packages of Examples of the present invention.
Figure 9B:
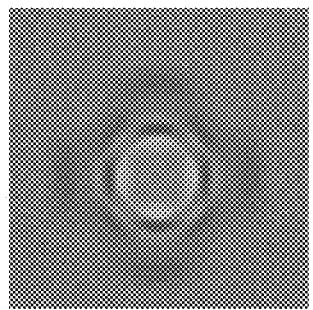
Figure 9C:
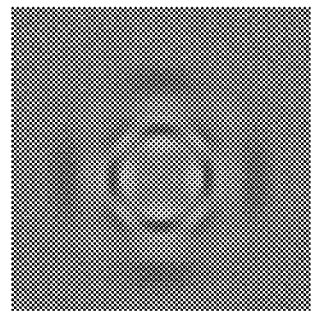
Figure 9D:
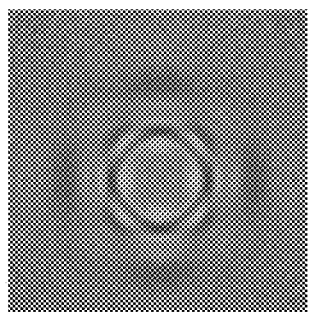
Figure 9E:
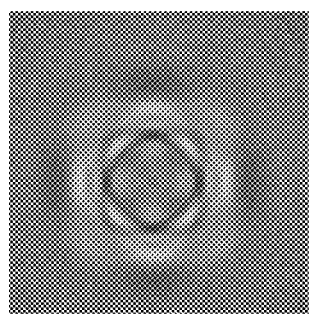
Figure 9F:
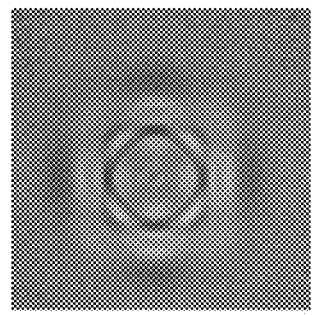
Figure 9G:
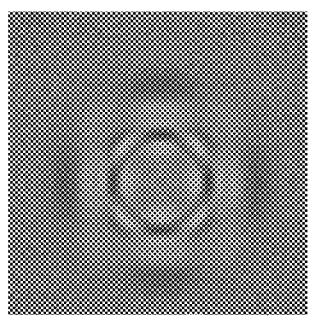
Figure 9H:
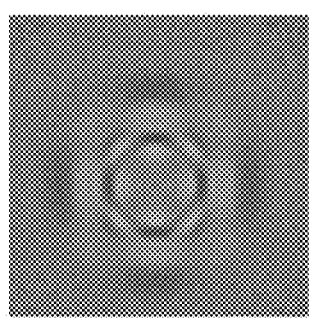
Figure 9I:
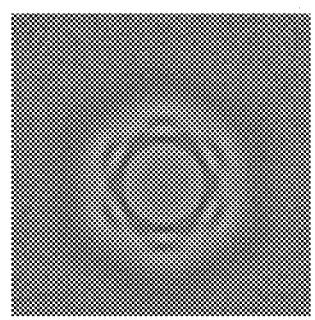
Figure 9J:
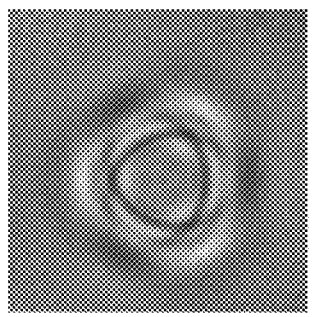
Figure 9K:
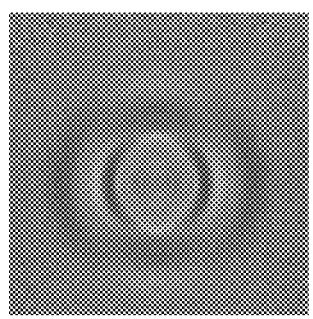
Figure 10A:
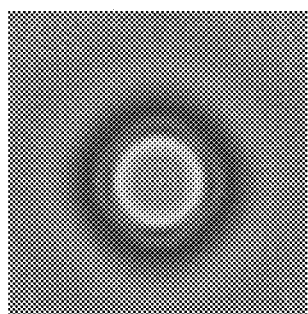
FIGS. 10A to 10F show color unevenness of white LED packages of Comparative Examples.
Figure 10B:
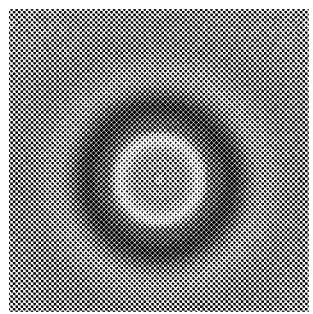
Figure 10C:
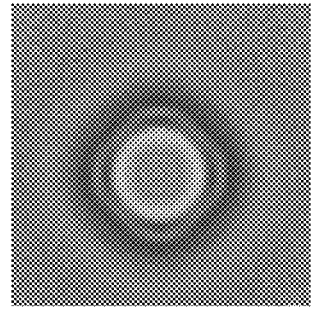
Figure 10D:
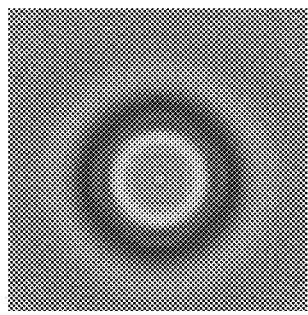
Figure 10E:
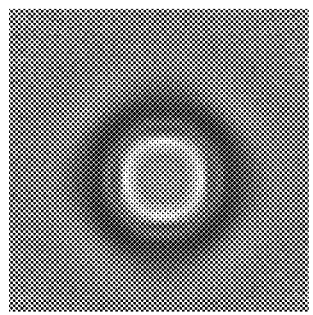
Figure 10F:
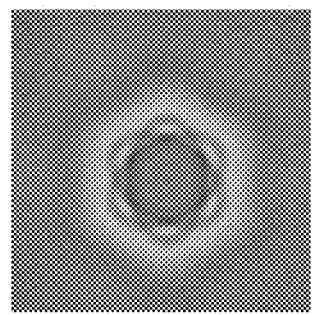

FIG. 5 is a sectional view of white LED package 220, and FIGS. 6A and 6B are plan views of light-emitting surface 221 of white LED package 220.

As illustrated in FIG. 5, white LED package 220 according to the present embodiment includes a plurality of blue LED chips 10, and sealing member 20 that includes yellow phosphor 2 and seals the plurality of blue LED chips 10. In the present embodiment, the plurality of blue LED chips 10 is disposed in a resin frame, and the resin frame is filled with sealing member 20.

In white LED package 220, blue light is emitted from the plurality of blue LED chips 10. When a part of the blue light impinges on yellow phosphor 2 in sealing member 20, yellow light is generated from yellow phosphor 2, and the yellow light is emitted from light-emitting surface 221. On the other hand, another part of the blue light does not impinge on yellow phosphor 2 in sealing member 20, and is emitted from light-emitting surface 221 as it is. The yellow light and blue light emitted from light-emitting surface 221 are mixed and thus white light is obtained. The intensities of the blue light and the yellow light emitted from light-emitting surface 221 of white LED package 220 are substantially the same.

Blue LED chip 10 is a semiconductor element that emits light with a wavelength in the blue region. For example, blue LED chip 10 emits blue light with a light-emission wavelength band of approximately 450 nm to 460 nm. The shape of the light-emitting surface of blue LED chip 10 is not limited, and is, for example, a rectangular shape. The plurality of blue LED chips 10 is disposed in the resin frame.

The number of blue LED chips 10 is not limited as long as a plurality of blue LED chips 10 is provided. The number of blue LED chips is, for example, 2, 3, or 4. In addition, preferably, the plurality of blue LED chips 10 is disposed without being clustered in a specific region in the light-emitting surface. For example, preferably, in plan view of white LED package 220, the plurality of blue LED chips 10 is disposed in the proximity of positions rotationally symmetrical about the center or center of gravity of light-emitting surface 221. More specifically, in the case where white LED package 220 includes two blue LED chips 10, the two blue LED chips 10 are preferably disposed at an interval of 180°±20° around the center or center of gravity of the light-emitting surface. In addition, it is more preferable that they are disposed at an interval of 180°±10°, and it is still more preferable that they are disposed at an interval of 180° (2-fold rotational symmetry). Likewise, in the case where white LED package 220 includes three blue LED chips 10, the three blue LED chips 10 are preferably disposed at an interval of 120°±20° around the center or center of gravity of the light-emitting surface. In addition, it is more preferable that they are disposed at an interval of 120°±10°, and it is still more preferable that they are disposed at an interval of 120° (3-fold rotational symmetry). In the case where white LED package 220 includes four blue LED chips 10, the four blue LED chips 10 are preferably disposed at an interval of 90°±20° around the center or center of gravity of the light-emitting surface. It is more preferable that they are disposed at an interval of 90°±10°, and it is still more preferable that they are disposed at an interval of 90° (4-fold rotational symmetry).

Note that the center or center of gravity of the plurality of blue LED chips 10 (the center or center of gravity of each blue LED chip 10) may be shifted from the center or center of gravity of light-emitting surface 221.

Sealing member 20, which is provided in the space surrounded by the resin frame, integrally covers and protects (seals) the plurality of blue LED chips 10. In the present embodiment, the surface of sealing member 20 exposed to the outside serves as light-emitting surface 221 of white LED package 220. For example, the shape of light-emitting surface 221 is, but not limited to, a circular shape or a rectangular shape. The type of sealing member 20 is, for example, a colorless and transparent thermosetting resin such as epoxy resin and silicone resin, but is not limited as long as blue light and yellow light can be appropriately transmitted.

Yellow phosphor 2 is a phosphor particle that emits yellow light when excited by blue light, and is dispersed or settled in sealing member 20. The type of yellow phosphor 2 is not limited as long as it emits yellow light when excited by blue light from blue LED chip 10. Yellow phosphor 2 is, for example, yttrium aluminum garnet (YAG). The amount of yellow phosphor 2 is adjusted such that the intensities of the blue light and yellow light emitted from light-emitting surface 221 of white LED package 220 are substantially equal to each other.

White LED package 220 according to the present embodiment is configured to satisfy the following condition 1 and condition 2 when viewed in plan view. Specifically, the plurality of blue LED chips 10 is arranged to satisfy the following condition 1 and condition 2.

Condition 1

The absolute value of the difference between IB×B and EB×B is 55% or smaller

Condition 2

The absolute value of the difference between IY×Y and EY×Y is 55% or smaller

In the condition 1 and condition 2, B is the light emission density of the blue light that is calculated from the intensity of the blue light and the area of blue LED chip 10 in plan view of light-emitting surface 221 on the assumption that the intensities of the blue light and yellow light emitted from light-emitting surface 221 of white LED package 220 are equal to each other. Y is the light emission density of the yellow light that is calculated from the intensity of the yellow light and the area of the region where no blue LED chip 10 is disposed in plan view of light-emitting surface 221 on the assumption that the intensities of the blue light and yellow light emitted from light-emitting surface 221 of white LED package 220 are equal to each other. IB is the ratio (%) of the area of blue LED chips 10 in the inner region with respect to the area of the inner region in the case where, in plan view of white LED package 220, the area of light-emitting surface 221 is divided into two equal parts, the inner region and the outer region, by the boundary line as the outer edge of a region similar in shape to light-emitting surface 221, which has the center or center of gravity at the position same as the center or center of gravity of light-emitting surface 221. IY is the ratio (%) of the area of the region where no blue LED chip 10 is disposed in the inner region with respect to the area of the inner region in plan view of white LED package 220. EB is the ratio (%) of the area of blue LED chips 10 in the outer region with respect to the area of the outer region in plan view of white LED package 220. EY is the ratio (%) of the area of the region where no blue LED chip is disposed in the outer region with respect to the area of the outer region in plan view of white LED package 220.

The conditions are described below with reference to FIGS. 6A to 7K. First, blue light emission density B and yellow light emission density Y are described, and then ratios of the areas IB, EB, IY and EY are described, and thereafter, conditions 1 and 2 are described.

Light Emission Density B of Blue Light and Light Emission Density Y of Yellow Light FIG. 6A is a plan view of light-emitting surface 221 of white LED package 220. As illustrated in FIG. 6A, in plan view of light-emitting surface 221, there is a region where blue LED chip 10 (and sealing member 20) is disposed, and a region where no blue LED chip 10 is disposed (region where only sealing member 20 is disposed).

Here, it is assumed that the intensities of the blue light and yellow light emitted from light-emitting surface 221 of white LED package 220 are equal to each other (e.g., 1). Blue light emission density B is a value obtained by dividing the emission intensity of the blue light by the total area of the plurality of blue LED chips 10 in plan view of light-emitting surface 221. Yellow light emission density Y is a value obtained by dividing the emission intensity of the yellow light by the area of the region where no blue LED chip 10 is disposed in plan view of light-emitting surface 221.

Ratios of Areas IB, IY, EB and EY

FIG. 6B illustrates a state where, in light-emitting surface 221 illustrated in FIG. 6A, the area of light-emitting surface 221 is divided into two equal parts, the inner region 40 and outer region 50, by boundary line 30 as the outer edge of a region similar in shape to light-emitting surface 221, which has the center or center of gravity at the same position as the center or center of gravity of light-emitting surface 221. The shape defined by the outer edge of light-emitting surface 221 and the shape defined by boundary line 30 are similar to each other in shape, and are disposed in the same orientation.

After the region is divided into the inner region 40 and outer region 50, the ratio of the total area of blue LED chips 10 inside the inner region 40 with respect to the area of the inner region 40 is set as IB (%), the ratio of the area of the region where no blue LED chip 10 is disposed inside the inner region 40 with respect to the area of the inner region 40 is set as IY (%), the ratio of the total area of blue LED chips 10 inside outer region 50 with respect to the area of outer region 50 is set as EB (%), and the ratio of the area of the region where no blue LED chip 10 is disposed inside outer region 50 with respect to the area of outer region 50 is set as EY (%).

Conditions 1 and 2

With blue light emission density B, yellow light emission density Y, and each of ratios of the areas IB, IY, EB and EY defined in the above-described manner, the absolute value of the difference between IB×B and EB×B is 55% or smaller in condition 1, and the absolute value of the difference between IY×Y and EY×Y is 55% or smaller in condition 2.

IB×B in condition 1, which is ratio TB of the total area of blue LED chips 10 in the inner region 40 multiplied by blue light emission density B, indicates the emission intensity of the blue light in the inner region 40. Likewise, EB×B in condition 1, which is ratio EB of the total area of blue LED chips 10 in outer region 50 multiplied by blue light emission intensity B, indicates the emission intensity of the blue light in outer region 50. Accordingly, the absolute value of the difference between IB×B and EB×B indicates a difference between the emission intensity of the blue light in the inner region 40 and the emission intensity of the blue light in outer region 50. When this difference is 55% or smaller, the balance of the blue light between the inner region 40 and outer region 50 is favorable and color unevenness is suppressed.

IY×Y in condition 2, which is ratio IY of the area of the region where no blue LED chip 10 is disposed in the inner region 40 multiplied by yellow light emission density Y, indicates the emission intensity of the yellow light in the inner region 40. Likewise, EY×Y in condition 2, which is ratio EY of the area of the region where no blue LED chip 10 is disposed in outer region 50 multiplied by yellow light emission density Y, indicates the emission intensity of the yellow light in outer region 50. Accordingly, the absolute value of the difference between IY×Y and EY×Y indicates a difference between the emission intensity of the yellow light in the inner region 40 and the emission intensity of the yellow light in outer region 50. When this difference is 55% or smaller, the balance of the yellow light between the inner region 40 and outer region 50 is favorable and color unevenness is suppressed.

In a known white LED package, a plurality of blue LED chips is disposed in the proximity of the center of the light-emitting surface. As such, in the known white LED package, IB×B is large and EB×B is small, and consequently, the absolute value of the difference between IB×B and EB×B is greater than 55%. In addition, in the known white LED package, IY×Y is small and EY×Y is large, and consequently, the absolute value of the difference between IY×Y and EY×Y is greater than 55%.

Note that, preferably, from a view point of suppression of color unevenness, the absolute value of the difference between IB×B and EB×B is 33% or smaller, and the absolute value of the difference between IY×Y and EY×Y is 33% or smaller. More preferably, the absolute value of the difference between IB×B and EB×B is 10% or smaller, and the absolute value of the difference between IY×Y and EY×Y is 10% or smaller.

Note that the absolute value of the difference between IB×B and EB×B and the absolute value of the difference between IY×Y and EY×Y have the same numerical value.

Simulations

FIGS. 7A to 7K are plan views of light-emitting surfaces 221 of white LED packages 220 of Examples 1 to 11 that satisfy the conditions 1 and 2. FIGS. 8A to 8F are plan views of the light-emitting surfaces of the white LED packages of Comparative Examples 1 to 6 that that do not satisfy the conditions 1 and 2. Table 1 shows parameters of the white LED packages of Examples 1 to 11 and Comparative Examples 1 to 6. Comparing Examples and Comparative Examples, the plurality of blue LED chips 10 is disposed in the inner region 40 and outer region 50 in a more balanced manner in white LED packages 220 of Examples.

FIGS. 9A to 9K show the color unevenness on light diffusion plate 120 in the case where diffusion lens 310 and light diffusion plate 120 are disposed over white LED packages 220 of Examples 1 to 11 as illustrated in FIG. 3. FIGS. 10A to 10F show the color unevenness obtained in the same manner with white LED packages of Comparative Examples 1 to 6. In FIGS. 9 and 10, the whiter the color is, the more yellowish it is, and the blacker the color is, the more blueish it is, and, the gray area is white light with a good balance between yellow and blue.

The following Table 1 shows results of evaluations on white light of the white LED packages of Examples 1 to 11 and Comparative Examples 1 to 6. In the results of evaluations in Table 1, "Good" indicates a case where the color unevenness of the white light was small, "Excellent" indicates a case where the color unevenness of the white light was especially small, and "Poor" indicates a case where the color unevenness of the white light was large.

Figure 11:
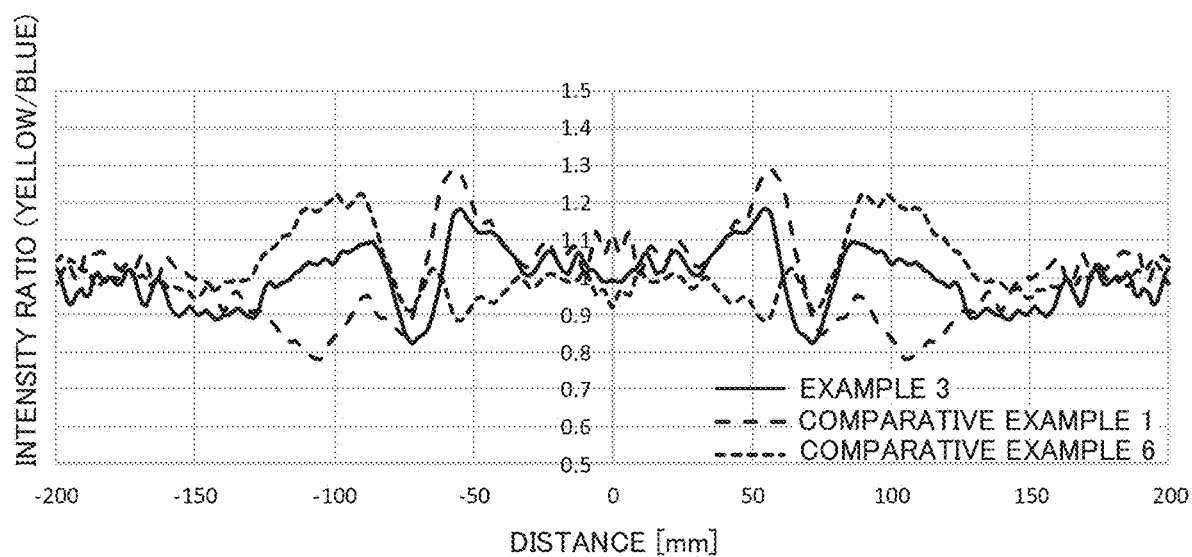
FIG. 11 is a graph illustrating intensity ratios of yellow light and blue light in white LED packages of Example 3, Comparative Example 1 and Comparative Example 6.

In addition, the graph in FIG. 11 shows a distribution of the intensity ratio of the yellow light with respect to the blue light on light diffusion plate 120 in Example 3 and Comparative Examples 1 and 6. Note that the graph in FIG. 11 shows a distribution of the intensity ratio on a straight line in the X-axis direction illustrated in FIGS. 7 and 8, which passes through the light axis of white LED package. As clearly shown in FIG. 11, in Example 3, the intensity ratio of the yellow light and the blue light was close to 1 than in Comparative Examples 1 and 6, and white light with no color unevenness was obtained.

In addition, while four blue LED chips 10 are provided in Examples 1 to 8, six blue LED chips 10 are provided in Example 9, three blue LED chips 10 are provided in Example 10, and two blue LED chips 10 are provided in Example 11 (see FIG. 7), white light with small color unevenness was obtained regardless of the number of blue LED chips 10 as long as conditions 1 and 2 are satisfied.

In addition, while light-emitting surface 221 has a circular shape in Examples 1 to 10 and light-emitting surface 221 has a rectangular (oblong) shape in Example 11 (see FIG. 7), white light with small color unevenness was obtained regardless of the shape of light-emitting surface 221 as long as conditions 1 and 2 are satisfied.

Figure 12A:
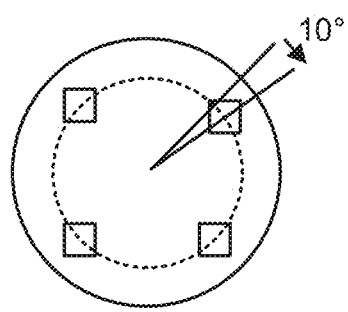
FIG. 12A illustrates a case where one blue LED chip is rotated by 10 degrees among blue LED chips rotationally symmetrical about the center or center of gravity of the light-emitting surface of the white LED package.
Figure 12B:
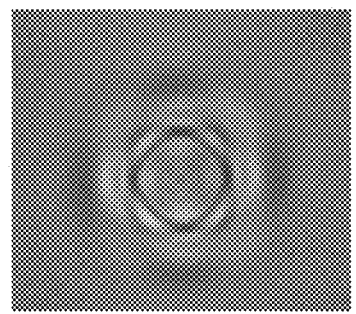
FIG. 12B shows color unevenness of the white LED package of the case illustrated in FIG. 12A.

FIG. 12A illustrates Example 12 in which one blue LED chip is rotated by 10 degrees among blue LED chips rotationally symmetrical about the center or center of gravity of the light-emitting surface of white LED package 220 of Example 6. FIG. 12B shows the color unevenness on light diffusion plate 120 in the case where diffusion lens 310 and light diffusion plate 120 are disposed over white LED package 220 of Example 12 as illustrated in FIG. 3. Also in

TABLE 1

| | Intensity of Inner Region | | Intensity of Outer Region | | Difference Between Inside and Outside | | |
|---|---|---|---|---|---|---|---|
| | | | | | Condition 1 Absolute Value of Difference | Condition 2 Absolute Value of Difference | |
| | Blue Light IB × B | Yellow Light IY × Y | Blue Light EB × B | Yellow Light EY × Y | between IB × B and EB × B | between IY × Y and EY × Y | Evaluation |
| Ex. 1 | 70% | 30% | 18% | 82% | 53% | 53% | Good |
| Ex. 2 | 65% | 35% | 30% | 70% | 35% | 35% | Good |
| Ex. 3 | 56% | 44% | 43% | 57% | 13% | 13% | Excellent |
| Ex. 4 | 61% | 39% | 31% | 69% | 29% | 29% | Excellent |
| Ex. 5 | 29% | 71% | 62% | 38% | 33% | 33% | Excellent |
| Ex. 6 | 48% | 52% | 52% | 48% | 3% | 3% | Excellent |
| Ex. 7 | 52% | 48% | 48% | 52% | 5% | 5% | Excellent |
| Ex. 8 | 51% | 49% | 49% | 51% | 2% | 2% | Excellent |
| Ex. 9 | 49% | 51% | 51% | 49% | 2% | 2% | Excellent |
| Ex. 10 | 49% | 51% | 51% | 49% | 2% | 2% | Excellent |
| Ex. 11 | 64% | 36% | 41% | 59% | 23% | 23% | Excellent |
| Comp. Ex.1 | 76% | 24% | 2% | 98% | 74% | 74% | Poor |
| Comp. Ex.2 | 76% | 24% | 0% | 100% | 76% | 76% | Poor |
| Comp. Ex.3 | 68% | 32% | 0% | 100% | 68% | 68% | Poor |
| Comp. Ex.4 | 68% | 32% | 0% | 100% | 68% | 68% | Poor |
| Comp. Ex.5 | 99% | 1% | 16% | 84% | 83% | 83% | Poor |
| Comp. Ex.6 | 2% | 98% | 69% | 31% | 67% | 67% | Poor |

As shown in Table 1, light-emitting surfaces 221 of white LED packages 220 of Examples 1 to 11 that satisfy conditions 1 and 2 resulted in white light with less color unevenness in comparison with the light-emitting surfaces of the white LED packages of Comparative Examples 1 to 6.

Further, among Examples 1 to 11, white light with a small color unevenness was obtained especially in Examples 3 to 11 in which the absolute value of the difference between IB×B and EB×B is 33% or smaller and the absolute value of the difference between IY×Y and EY×Y is 33% or smaller.

FIG. 12B, the whiter the color is, the more yellowish it is, and the blacker the color is, the more blueish it is, and, the gray area is white light with a good balance between yellow and blue.

The following Table 2 shows results of evaluations on white light of white LED packages of Examples 6 and 12. In results of evaluations in Table 2, "Good" indicates a case where the color unevenness of the white light was small, "Excellent" indicates a case where the color unevenness of the white light was especially small, and "Poor" indicates a case where the color unevenness of the white light was large.

TABLE 2

| | Intensity of Inner Region | | Intensity of Outer Region | | Difference Between Inside and Outside | | |
|---|---|---|---|---|---|---|---|
| | | | | | Condition 1 Absolute Value of Difference | Condition 2 Absolute Value of Difference | |
| | Blue Light IB × B | Yellow Light IY × Y | Blue Light EB × B | Yellow Light EY × Y | between IE × B and EB × B | between IY × Y and EY × Y | Evaluation |
| Ex.6 | 48% | 52% | 52% | 48% | 3% | 3% | Excellent |
| Ex.12 | 48% | 52% | 52% | 48% | 3% | 3% | Excellent |

As shown in Table 2, light-emitting surfaces 221 of white LED packages 220 of Examples 6 and 12 that satisfy conditions 1 and 2 resulted in white light with small color unevenness.

Note that each numerical value in Tables 1 and 2 is rounded to the nearest whole number, and therefore calculation of the difference from the two intensity values may not agree with the numerical value of the difference between the two intensities.

Effect

As described above, in white LED package 220 according to the present embodiment, the difference between the emission intensity of the blue light in the inner region 40 and the emission intensity of the blue light in outer region 50 is small, and the difference between the emission intensity of the yellow light in the inner region 40 and the emission intensity of the yellow light in outer region 50 is small. Thus, the intensity difference between the blue light and the yellow light is small for light emitted in any direction, and small color unevenness is achieved.

Note that while light flux controlling member 300 is diffusion lens 310 in the above-mentioned embodiment, light flux controlling member 300 may not be diffusion lens 310. For example, light flux controlling member 300 may be reflection lens 320 illustrated in FIGS. 13A to 13D, or condenser lens 330 illustrated in FIGS. 14A to 14D. Reflection lens 320 and condenser lens 330 are described below.

Figures 13A, 13B:
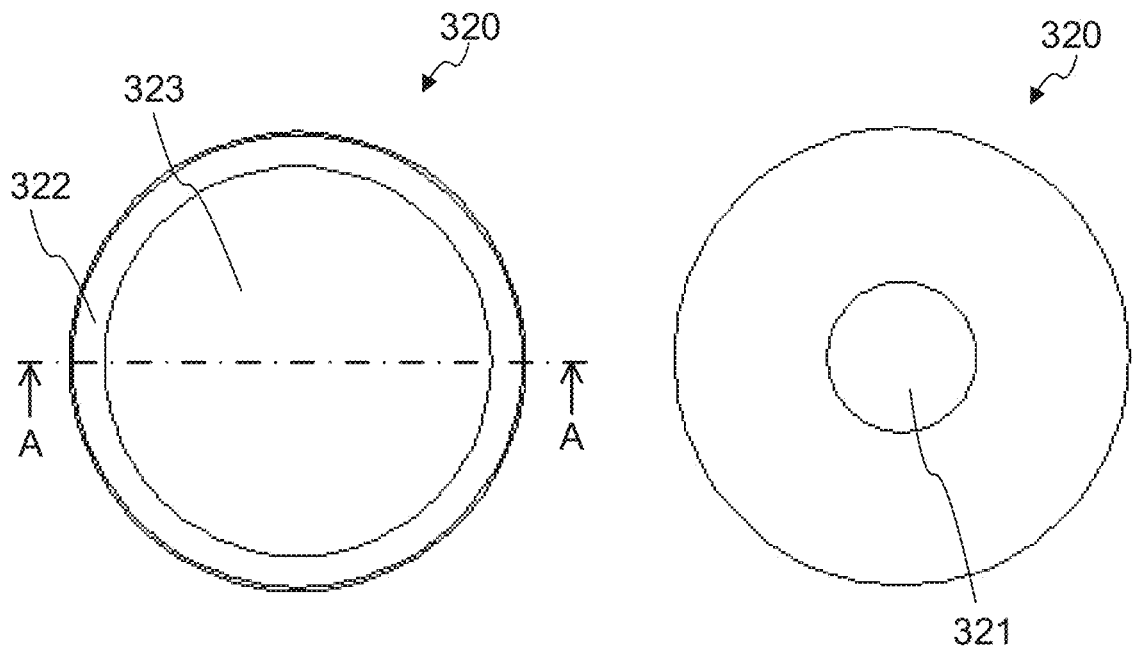
FIG. 13A is a plan view illustrating a reflection lens.
FIG. 13B is a bottom view.
Figures 13C, 13D:
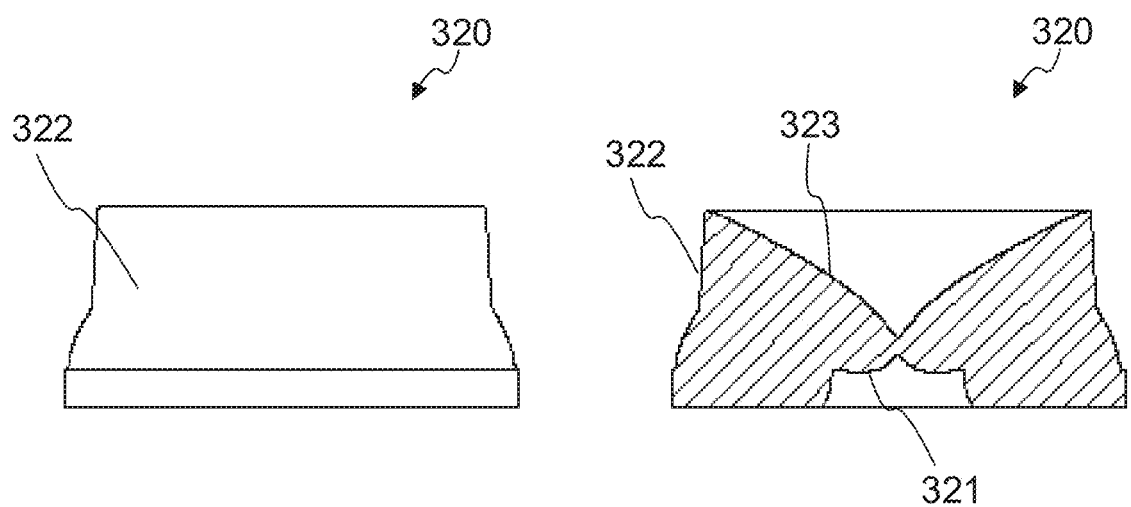
FIG. 13C is a side view.
FIG. 13D is a sectional view taken along line A-A of FIG. 13A.

FIG. 13A is a plan view of reflection lens 320, FIG. 13B is a bottom view of reflection lens 320, FIG. 13C is a side view of reflection lens 320, and FIG. 13D is a sectional view taken along line A-A of FIG. 13A. Reflection lens 320 laterally reflects a part of light entered from incidence surface 321 at reflection surface 323 in a direction away from optical axis. The reflected is emitted from light emission surface 322 in a lateral direction.

Figure 14A:
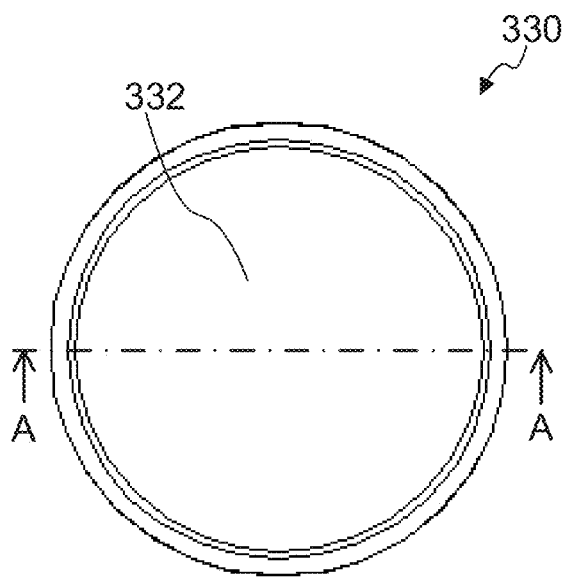
FIG. 14A is a plan view illustrating a condenser lens.
Figure 14B:
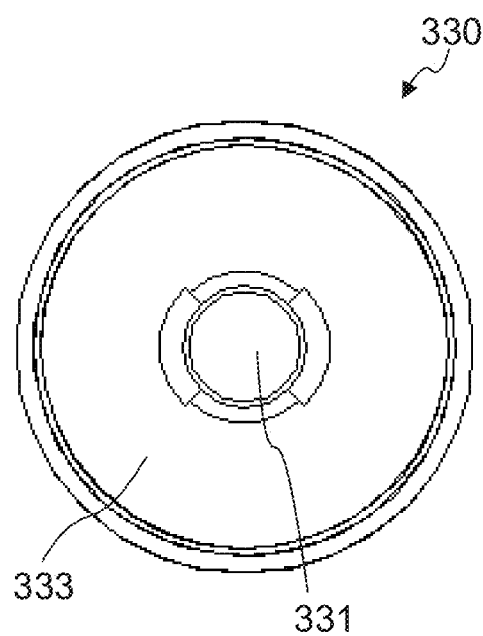
FIG. 14B is a bottom view.
Figure 14C:
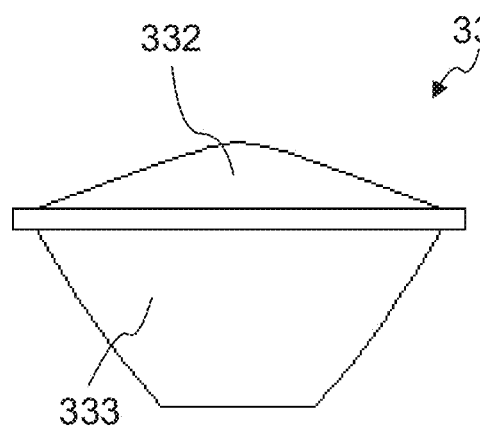
FIG. 14C is a side view.
Figure 14D:
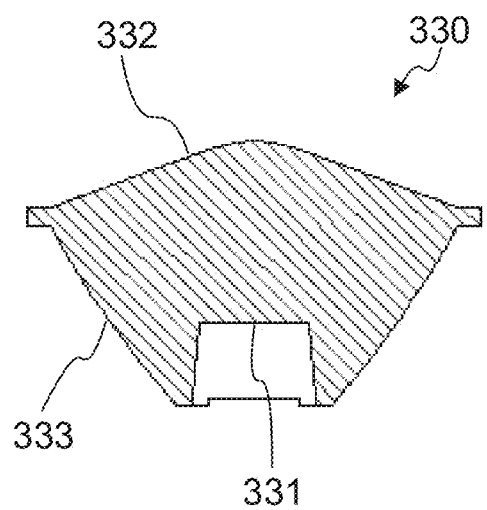
FIG. 14D is a sectional view taken along line A-A of FIG. 14A.

FIG. 14A is a plan view of condenser lens 330, FIG. 14B is a bottom view of condenser lens 330, FIG. 14C is a side view of condenser lens 330, and FIG. 14D is a sectional view taken along line A-A of FIG. 14A. Condenser lens 330 reflects a part of light entered from incidence surface 331 at reflection surface 333 in a direction along the optical axis. The reflected light is emitted from emission surface 332 in a direction along the optical axis.

INDUSTRIAL APPLICABILITY

The white LED chip package, the light-emitting device and the surface light source device according to the present invention are applicable to a backlight of a liquid crystal display apparatus, a generally-used illumination apparatuses and the like, for example.

REFERENCE SIGNS LIST

2 Yellow phosphor
10 Blue LED chip
20 Sealing member
30 Boundary line
40 Inner region
50 Outer region
100 Surface light source device
100' Display device
102 Display member (Irradiation target member)
110 Housing
112 Bottom plate
114 Top plate
120 Light diffusion plate
200 Light-emitting device
210 Substrate
220 White LED package
221 Light-emitting surface
300 Light flux controlling member
301, 311, 321, 331 Incidence surface
302, 312, 322, 332 Emission surface
310 Diffusion lens
320 Reflection lens
323, 333 Reflection surface
330 Condenser lens

The invention claimed is:

1. A white LED package comprising:
a plurality of blue LED chips, and a sealing member including a yellow phosphor and configured to seal the plurality of blue LED chips,
wherein assuming that intensities of blue light and yellow light emitted from a light-emitting surface of the white LED package are equal to each other, a blue light emission density B is calculated from the intensity of the blue light and an area of the plurality of blue LED chips in plan view of the light-emitting surface, and a yellow light emission density Y is calculated from the intensity of the yellow light and an area of a region where the plurality of blue LED chips is not disposed in plan view of the light-emitting surface; and
wherein the following condition 1 and condition 2 are satisfied:
the condition 1: an absolute value of a difference between IB×B and EB×B is 55% or smaller; and
the condition 2: an absolute value of a difference between IY×Y and EY×Y is 55% or smaller, where, when an area of the light-emitting surface is divided into an inner region and an outer region so as to divide the area into two equal parts by a boundary line as an outer edge of a similar region that is similar in shape to the light-emitting surface in plan view of the white LED package, the similar region having a center or a center of gravity at a same position as a center or a center of gravity of the light-emitting surface, IB (%) is a ratio of an area of the plurality of blue LED chips in the inner region with respect to an area of the inner region;

IY (%) is a ratio of an area of a region where the plurality of blue LED chips is not disposed in the inner region with respect to the area of the inner region;

EB (%) is a ratio of an area of the plurality of blue LED chips in the outer region with respect to an area of the outer region; and EY (%) is a ratio of an area of a region where the plurality of blue LED chips is not disposed in the outer region with respect to the area of the outer region.

2. The white LED package according to claim 1, wherein the absolute value of the difference between IB×B and EB×B is 33% or smaller, and the absolute value of the difference between IY×Y and EY×Y is 33% or smaller.

3. The white LED package according to claim 1, wherein the plurality of blue LED chips is three or more blue LED chips.

4. The white LED package according to claim 1, wherein the white LED package is disposed at a position rotationally symmetrical about the center or center of gravity of the light-emitting surface.

5. A light-emitting device comprising:
the white LED package according to claim 1; and
a light flux controlling member configured to control light emitted from the white LED package.

6. The light-emitting device according to claim 5, wherein the light flux controlling member is a diffusion lens configured to emit, from an emission surface, incident light entered from an incidence surface while spreading the light, a reflection lens configured to laterally emit the incident light from the emission surface in a direction away from an optical axis, or a condenser lens configured to emit the incident light from the emission surface in a direction along the optical axis.

7. A surface light source device comprising:
the light-emitting device according to claim 4; and
a diffusion plate configured to transmit light emitted from the light-emitting device, the diffusion plate being configured to transmit the light while diffusing the light.

8. A display device comprising:
the surface light source device according to claim 7; and
a display member configured to be irradiated with light from the surface light source device.

* * * * *